US008101955B2

(12) United States Patent
Keh et al.

(10) Patent No.: US 8,101,955 B2
(45) Date of Patent: Jan. 24, 2012

(54) PLCC PACKAGE WITH A REFLECTOR CUP SURROUNDED BY AN ENCAPSULANT

(75) Inventors: Kean Loo Keh, Gelugor (MY); Lig Yi Yong, Simpang Ampat (MY); Kum Soon Wong, Kuala Lumpur (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 17 days.

(21) Appl. No.: 12/426,114

(22) Filed: Apr. 17, 2009

(65) Prior Publication Data

US 2010/0264437 A1    Oct. 21, 2010

(51) Int. Cl.
*H01L 33/00* (2010.01)

(52) U.S. Cl. ............ 257/81; 257/79; 257/89; 257/98; 257/99; 257/433; 257/666; 257/675; 257/676; 257/678; 257/724; 257/720; 257/731; 257/E21.499; 438/26

(58) Field of Classification Search ............ 257/98–100
See application file for complete search history.

(56) References Cited

U.S. PATENT DOCUMENTS

| | | | | |
|---|---|---|---|---|
| 5,444,726 A | * | 8/1995 | Kitamura et al. | 372/36 |
| 5,614,735 A | * | 3/1997 | Kitamura et al. | 257/99 |
| 5,825,794 A | * | 10/1998 | Ogino et al. | 372/36 |
| 6,061,160 A | * | 5/2000 | Maruyama | 398/201 |
| 6,335,548 B1 | * | 1/2002 | Roberts et al. | 257/98 |
| 6,344,689 B1 | * | 2/2002 | Suzuki et al. | 257/731 |
| 6,345,903 B1 | * | 2/2002 | Koike et al. | 362/241 |
| 6,355,946 B1 | * | 3/2002 | Ishinaga | 257/98 |
| 6,376,902 B1 | * | 4/2002 | Arndt | 257/678 |
| 6,407,411 B1 | * | 6/2002 | Wojnarowski et al. | 257/99 |
| 6,486,543 B1 | * | 11/2002 | Sano et al. | 257/684 |
| 6,603,148 B1 | * | 8/2003 | Sano et al. | 257/98 |
| 6,621,223 B1 | * | 9/2003 | Hen | 315/56 |
| D494,938 S | * | 8/2004 | Kamada | D13/182 |
| 6,809,261 B1 | * | 10/2004 | Ng et al. | 174/551 |
| 6,830,496 B2 | * | 12/2004 | Lin et al. | 445/49 |
| 6,849,867 B2 | | 2/2005 | Roberts | |
| 6,862,305 B2 | * | 3/2005 | Nishiyama | 372/36 |
| 6,879,040 B2 | * | 4/2005 | Ng et al. | 257/730 |
| 6,914,267 B2 | * | 7/2005 | Fukasawa et al. | 257/98 |

(Continued)

FOREIGN PATENT DOCUMENTS

WO    WO 2007/000037    1/2007

OTHER PUBLICATIONS

High-Brightness LED Technology-Review.

(Continued)

*Primary Examiner* — Victor A Mandala
*Assistant Examiner* — William Harriston

(57) ABSTRACT

In an embodiment, the invention provides a PLCC package comprising first and second lead frames, a plastic structural body, a light source, an encapsulant, and an optical lens. The first lead frame comprises two tongues and a reflector cup. The first and second lead frames are attached to the plastic structural body. The light source is mounted and electrically connected at the bottom of the inside of the reflector cup. The light source is also electrically connected to the second lead frame by a wire bond. The reflector cup is surrounded on at least four sides by the encapsulant, the encapsulant having a domed portion that functions as the optical lens, the encapsulant being an integral single piece structure.

20 Claims, 10 Drawing Sheets

U.S. PATENT DOCUMENTS

| | | | |
|---|---|---|---|
| 6,943,433 B2 * | 9/2005 | Kamada | 257/666 |
| D511,331 S * | 11/2005 | Horinouchi et al. | D13/182 |
| 7,030,423 B2 * | 4/2006 | Chang et al. | 257/98 |
| 7,183,588 B2 * | 2/2007 | Chia et al. | 257/99 |
| 7,211,882 B2 * | 5/2007 | Wang et al | 257/678 |
| 7,238,967 B2 * | 7/2007 | Kuwabara et al. | 257/98 |
| 7,242,033 B2 * | 7/2007 | Isokawa et al. | 257/99 |
| 7,253,448 B2 * | 8/2007 | Roberts et al. | 257/99 |
| 7,282,740 B2 * | 10/2007 | Chikugawa et al. | 257/79 |
| 7,335,522 B2 * | 2/2008 | Wang et al. | 438/26 |
| D563,333 S * | 3/2008 | Kim | D13/180 |
| 7,365,407 B2 * | 4/2008 | Ng et al. | 257/433 |
| 7,385,227 B2 * | 6/2008 | Mok et al. | 257/98 |
| 7,435,143 B2 | 10/2008 | Anderlini | |
| 7,462,870 B2 * | 12/2008 | Nakashima | 257/81 |
| 7,499,288 B2 * | 3/2009 | Tanaka et al. | 361/767 |
| 7,528,414 B2 * | 5/2009 | Huang et al. | 257/79 |
| 7,595,549 B2 * | 9/2009 | Kamikawa et al. | 257/676 |
| 7,635,915 B2 * | 12/2009 | Xie et al. | 257/692 |
| 7,655,958 B2 * | 2/2010 | Sanmyo | 257/99 |
| 7,663,199 B2 * | 2/2010 | Lee et al. | 257/433 |
| 7,675,145 B2 * | 3/2010 | Wong et al. | 257/676 |
| 7,709,754 B2 * | 5/2010 | Doogue et al. | 174/528 |
| 2002/0004251 A1 * | 1/2002 | Roberts et al. | 438/26 |
| 2003/0001166 A1 * | 1/2003 | Waalib-Singh et al. | 257/98 |
| 2003/0168720 A1 * | 9/2003 | Kamada | 257/666 |
| 2004/0052077 A1 * | 3/2004 | Shih | 362/294 |
| 2004/0227149 A1 | 11/2004 | Ibbetson | |
| 2004/0256706 A1 * | 12/2004 | Nakashima | 257/678 |
| 2005/0077623 A1 * | 4/2005 | Roberts et al. | 257/724 |
| 2005/0133810 A1 * | 6/2005 | Roberts et al. | 257/99 |
| 2005/0242708 A1 * | 11/2005 | Keong et al. | 313/498 |
| 2005/0263784 A1 * | 12/2005 | Yaw et al. | 257/98 |
| 2005/0269587 A1 * | 12/2005 | Loh et al. | 257/99 |
| 2006/0054912 A1 * | 3/2006 | Murakami et al. | 257/99 |
| 2006/0175716 A1 | 8/2006 | Nakashima | |
| 2006/0186428 A1 | 8/2006 | Tan | |
| 2006/0226435 A1 * | 10/2006 | Mok et al. | 257/98 |
| 2007/0034886 A1 | 2/2007 | Wong | |
| 2007/0063321 A1 * | 3/2007 | Han et al. | 257/675 |
| 2007/0081313 A1 * | 4/2007 | Tanaka et al. | 361/767 |
| 2007/0181901 A1 * | 8/2007 | Loh | 257/99 |
| 2007/0257272 A1 | 11/2007 | Hutchins | |
| 2008/0079019 A1 * | 4/2008 | Huang et al. | 257/99 |
| 2008/0191235 A1 * | 8/2008 | Wang et al. | 257/99 |
| 2008/0224162 A1 * | 9/2008 | Min et al. | 257/98 |
| 2008/0258162 A1 * | 10/2008 | Koung et al. | 257/98 |
| 2008/0273340 A1 * | 11/2008 | Ng et al. | 362/373 |
| 2008/0290352 A1 * | 11/2008 | Park | 257/89 |
| 2009/0032829 A1 * | 2/2009 | Chew et al. | 257/98 |
| 2009/0283781 A1 * | 11/2009 | Chan et al. | 257/89 |
| 2010/0072506 A1 * | 3/2010 | Bae et al. | 257/99 |
| 2010/0072592 A1 * | 3/2010 | Yong et al. | 257/676 |
| 2010/0133560 A1 * | 6/2010 | Kim et al. | 257/89 |

OTHER PUBLICATIONS

Richard Wilson, LED Packaging Gets Clever, Electronicsweekly, Apr. 19, 2005, 3 pages.

* cited by examiner

PLCC PACKAGE WITH A REFLECTOR CUP SURROUNDED BY AN ENCAPSULANT

BACKGROUND

Light emitting diodes (LEDs) have many advantages over conventional light sources, such as incandescent, halogen and fluorescent lamps. These advantages include longer operating life, lower power consumption and smaller size. Consequently, conventional light sources are increasingly being replaced with LEDs in traditional lighting applications. As an example, LEDs are currently being used in flashlights, traffic signal lights, automotive taillights and display devices.

Among the various packages for LEDs, an LED package of interest is the plastic leaded chip carrier (PLCC) package for a surface mount LED. Surface mount LEDs in PLCC packages may be used, for example, in automotive interior display devices, electronic signs and signals, and electrical equipment.

A concern with the current process for producing PLCC packages is the problem of thermal expansion between different materials used in PLCC packages. Because materials expand and contact differently, thermal stress is created between different materials. A coefficient of thermal expansion (CTE) is often used to characterize how different materials expand or contract with changes in temperature.

Thermal stress may initiate mini cracks along interfacial surfaces. Thermal stress may also cause de-lamination between a die and a lead frame for example. Thermal cycling conditions (i.e. repeated changes in temperature) that occur during normal operation may propagate mini cracks to the extent a die that is attached to a lead frame may be lifted from the lead frame.

Silicone is commonly used as a material to encapsulate a light source in a PLCC because it is soft and pliable. Because silicone is soft and pliable, it is often used to reduce cracks in a PLCC package. However, silicone is not as useful as other materials for use as an optical lens due to its softness.

DETAILED DESCRIPTION

Figure 1:
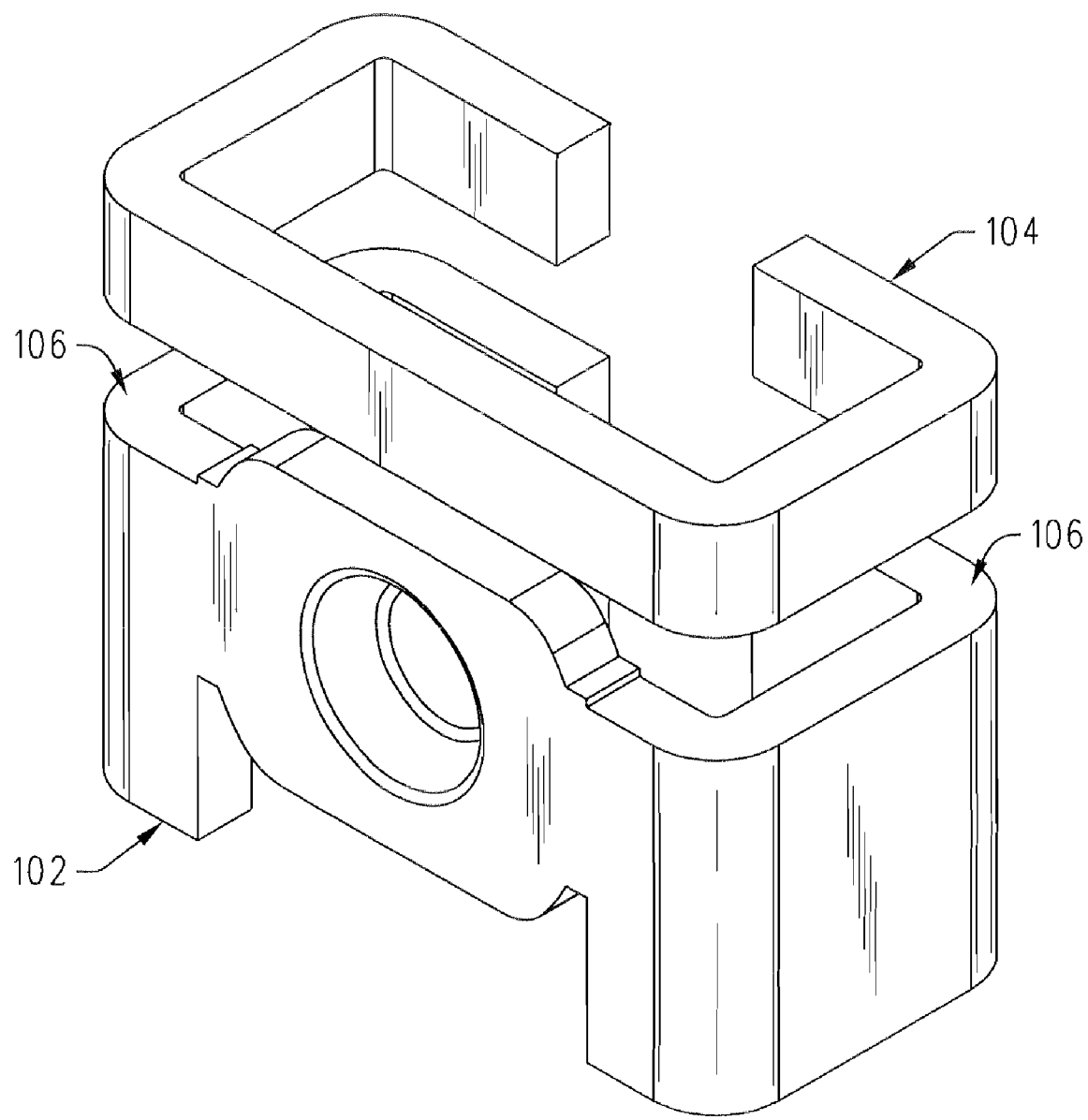
FIG. 1 is an isometric drawing of a first lead frame and second lead frame in accordance with an exemplary embodiment of the invention.

The drawings and description, in general, disclose a PLCC package 400 containing a reflector cup 202 in which four sides (210, 212, 106 and 208) of the reflector cup 202 are covered in an encapsulant 606. The encapsulant 606 has a domed portion that functions as an optical lens 402; the encapsulant 606 being an integral single piece structure. In one exemplary embodiment, the reflector cup 202 is fashioned, for example by stamping, on a first lead frame 102. The first lead frame 102 is attached to a plastic structural body 302 via first 204 and second 206 tongues. A second lead frame 104 is also attached to the plastic structural body 302. In this embodiment, a light source 602, for example an LED, is physically and electrically connected at the bottom of the reflector cup 202. A laser may also be used as a light source 602. In this exemplary embodiment, a wire bond 604 is connected to the light source 602 and the second lead frame 104.

The first 102 and second 104 lead frames provide electrical connections for the light source as well as leads for mounting. In this exemplary embodiment, the first 102 and second 104 lead frames also function as heat sinks to dissipate heat created by the light source 602.

After the light source 602 is mounted and electrically connected to the first 102 and second 104 lead frames, an encapsulant 606 fills a cavity 304 in the plastic structural body 302. Filling the cavity 304 in the plastic structural body 302 with the encapsulant 606 covers four sides (208, 210, 212 and 106) of the reflector cup 202. The encapsulant 606 also covers the wirebond 604 and the light source 602 in an exemplary embodiment. During the step of filling the cavity 304 of the plastic structural body 302 with encapsulant 606, a domed portion that functions as an optical lens 402 is formed on the PLCC package 400.

Because the encapsulant 606 covers four sides (208, 210, 212 and 106) of the reflector cup 202, a CTE mismatch between the encapsulant 606 and the plastic structural body 302 will be less likely to cause problems related to thermal stress. For example, the occurrence of de-lamination between the light source 602 and the first lead frame 102 due to a CTE mismatch between the encapsulant 606 and the plastic structural body 302, will be less likely. Also, the occurrence of de-lamination between the light source 602 and the first lead frame 102 due to a CTE mismatch between the encapsulant 606 and the first 102 and/or the second 104 lead frames, will be less likely. In addition, since the encapsulant 606 and the optical lens 402 are made of the same material, CTE mismatch problems between them are also less likely to cause problems related to thermal stress.

The first 204 and second 206 tongues that are an integral part of the first lead frame 102. The first 204 and the second 206 tongues are substantially rigid to reduce movement of the reflector cup 202. Reducing the movement of the reflector cup 202 lowers the probability of the wire bond 604 separating from either the light source 602 or the second lead frame 104. When the wire bond 604 separates from either the light source 602 or the second lead frame 104, the electrical connection is opened and the light source 602 will not function.

FIG. 1 is an isometric drawing of a first lead frame 102 and second lead frame 104 in accordance with an exemplary embodiment of the invention. In this exemplary embodiment, the first lead frame 102 and the second lead frame 104 have J-leads. However, it is anticipated that other leads such as SOJ leads, gull wing leads, reverse gull wing leads and straight cut leads may be used in other embodiments of this invention. One side 106 of the reflector cup 202 is also shown in FIG. 1.

Figure 2A:
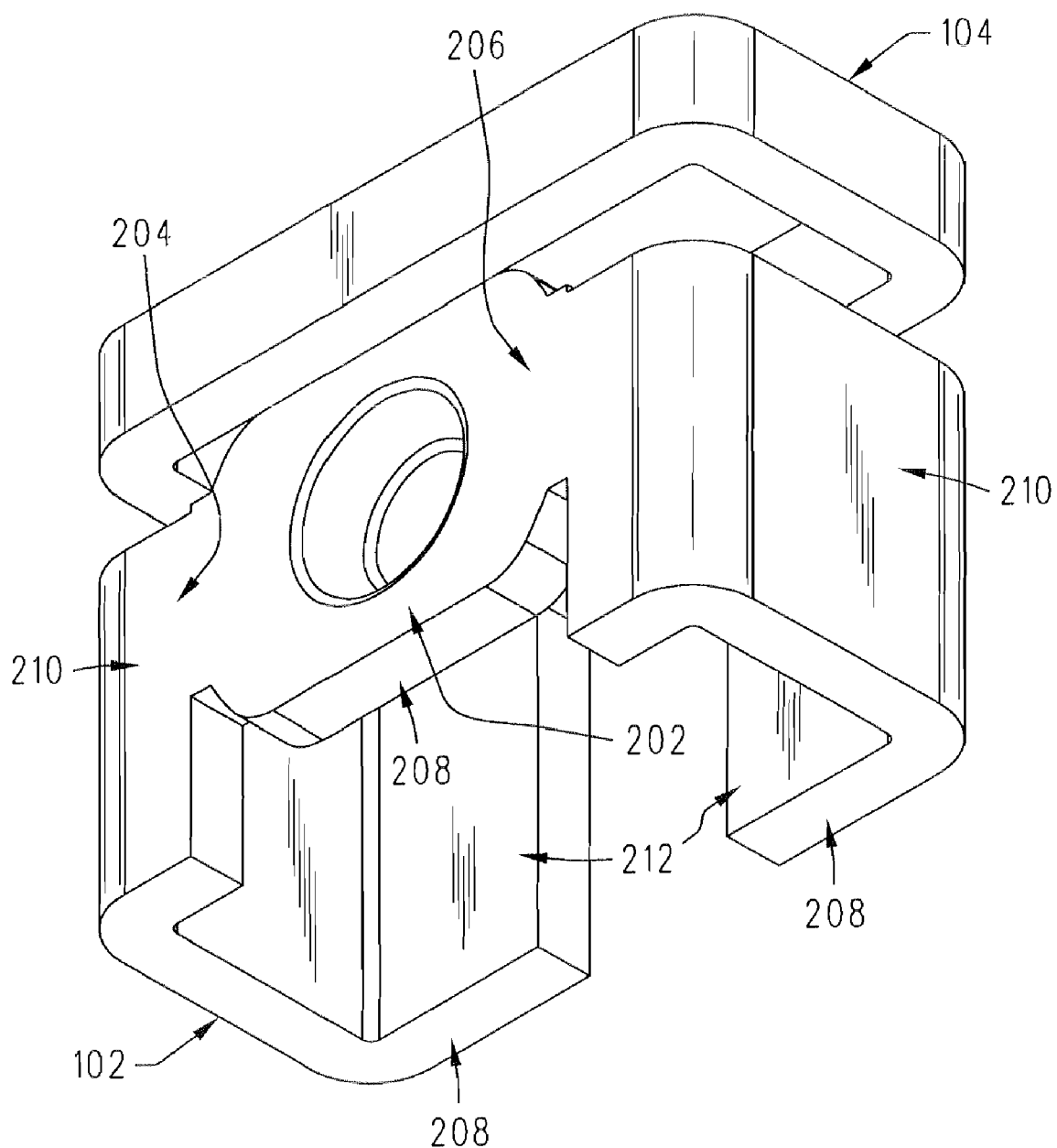
FIG. 2A is an isometric drawing of a first lead frame and second lead frame in accordance with an exemplary embodiment of the invention.

FIG. 2A is an isometric drawing of a first lead frame 102 and second lead frame 104 in accordance with an exemplary embodiment of the invention. In this exemplary embodiment, the first lead frame comprises a first tongue 204, a second tongue 206, and a reflector cup 202. Three sides (208, 210 and 212) of the reflector cup 202 are also shown in FIG. 2A. The reflector cup 202 may be formed by standard methods, for example by stamping the first lead frame 102. As will be discussed in more detail, the reflector cup 202, is surrounded on four sides (208, 210, 212 and 106) of the reflector cup 202 by an encapsulant 606.

The first 204 and second 206 tongues in this exemplary embodiment are substantially rigid so as to reduce movement of the reflector cup 202. Reducing movement of the reflector cup, among other things, reduces the probability that the electrical connection between the reflector cup 202 and the second lead frame will be open. If the electrical connection between the reflector cup 202 and the second lead frame is open, the light source 602 will not function. In this exemplary embodiment an electrical connection is made by a wire bond 604.

Figure 2B:
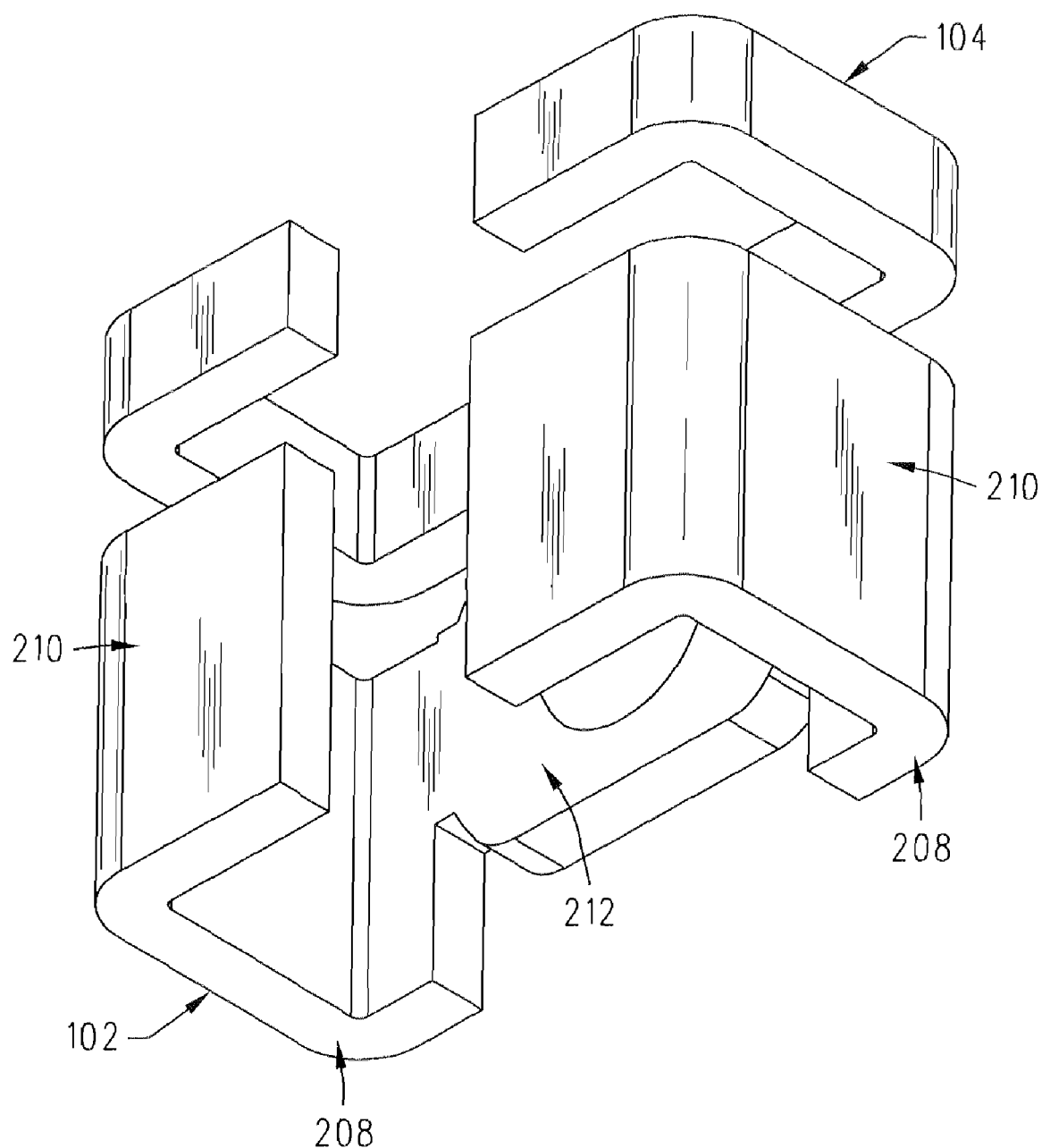
FIG. 2B is an isometric drawing of a first lead frame and second lead frame in accordance with an exemplary embodiment of the invention.

FIG. 2B is a third isometric drawing of a first lead frame 102 and second lead frame 104 in accordance with an exemplary embodiment of the invention. In this exemplary embodiment, the first lead frame comprises a first tongue 204, a second tongue 206, and a reflector cup 202. Two sides 208 and 212 of the reflector cup 202 are shown in FIG. 2B. As will be discussed in more detail, the reflector cup 202, is surrounded on four sides (208, 210, 212 and 106) of the reflector cup 202 by an encapsulant 606.

Figure 3:
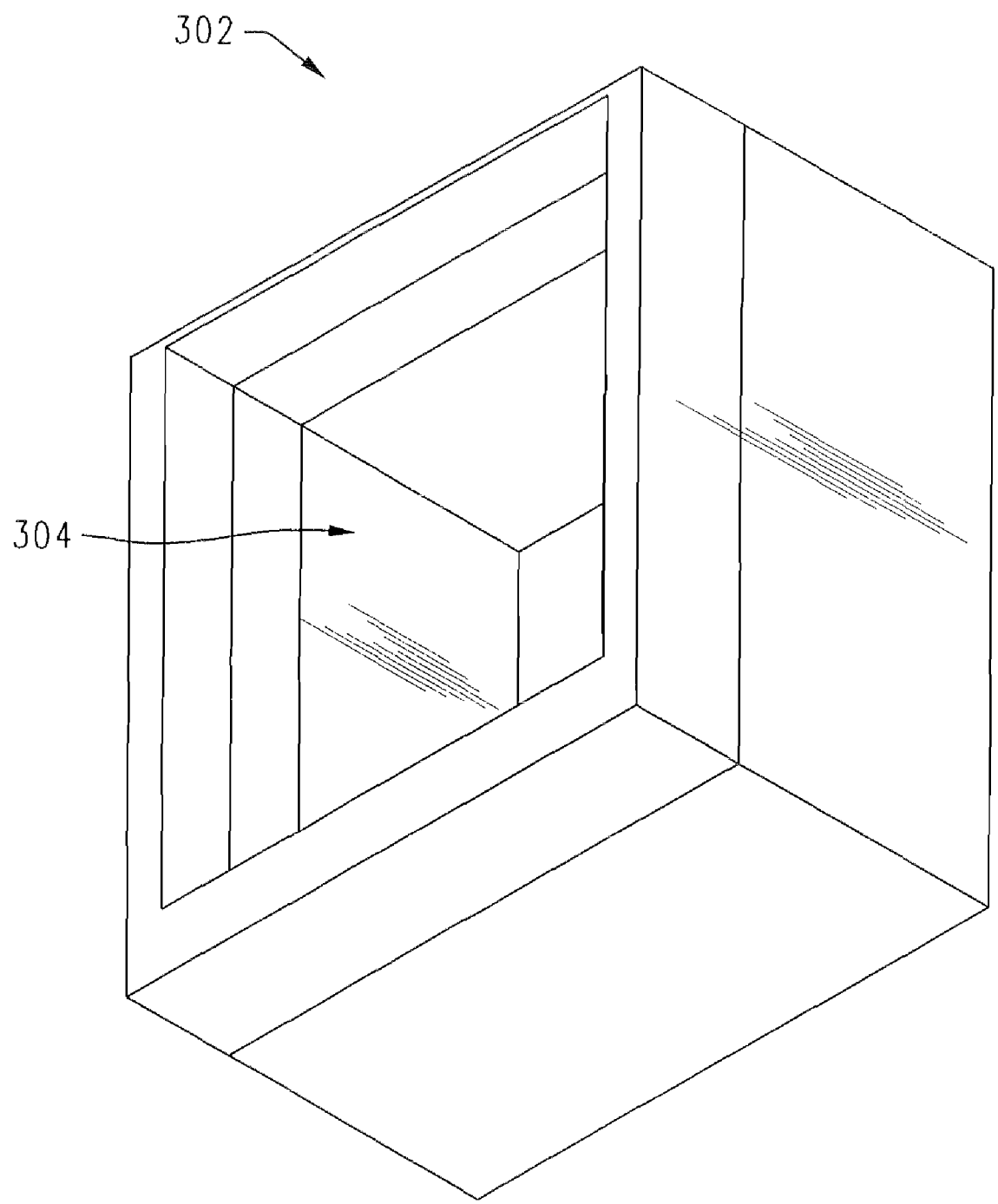
FIG. 3 is an isometric drawing of a plastic structural body in accordance with an exemplary embodiment of the invention.

FIG. 3 is an isometric drawing of a plastic structural body 302 in accordance with an exemplary embodiment of the invention. The plastic structural body 302 contains a cavity 304. In an exemplary embodiment, the cavity 304 may be used to contain a portion of encapsulant 606. In one embodiment, the plastic structural body 302 may be an integral single piece structure. In a second embodiment the plastic structural body 302 may have dimensions that conform to the PLCC-4 standard. The plastic structural body 302 may be made using any standard process. For example, an injection molding process may be used to form the plastic structural body 302.

Figure 4:
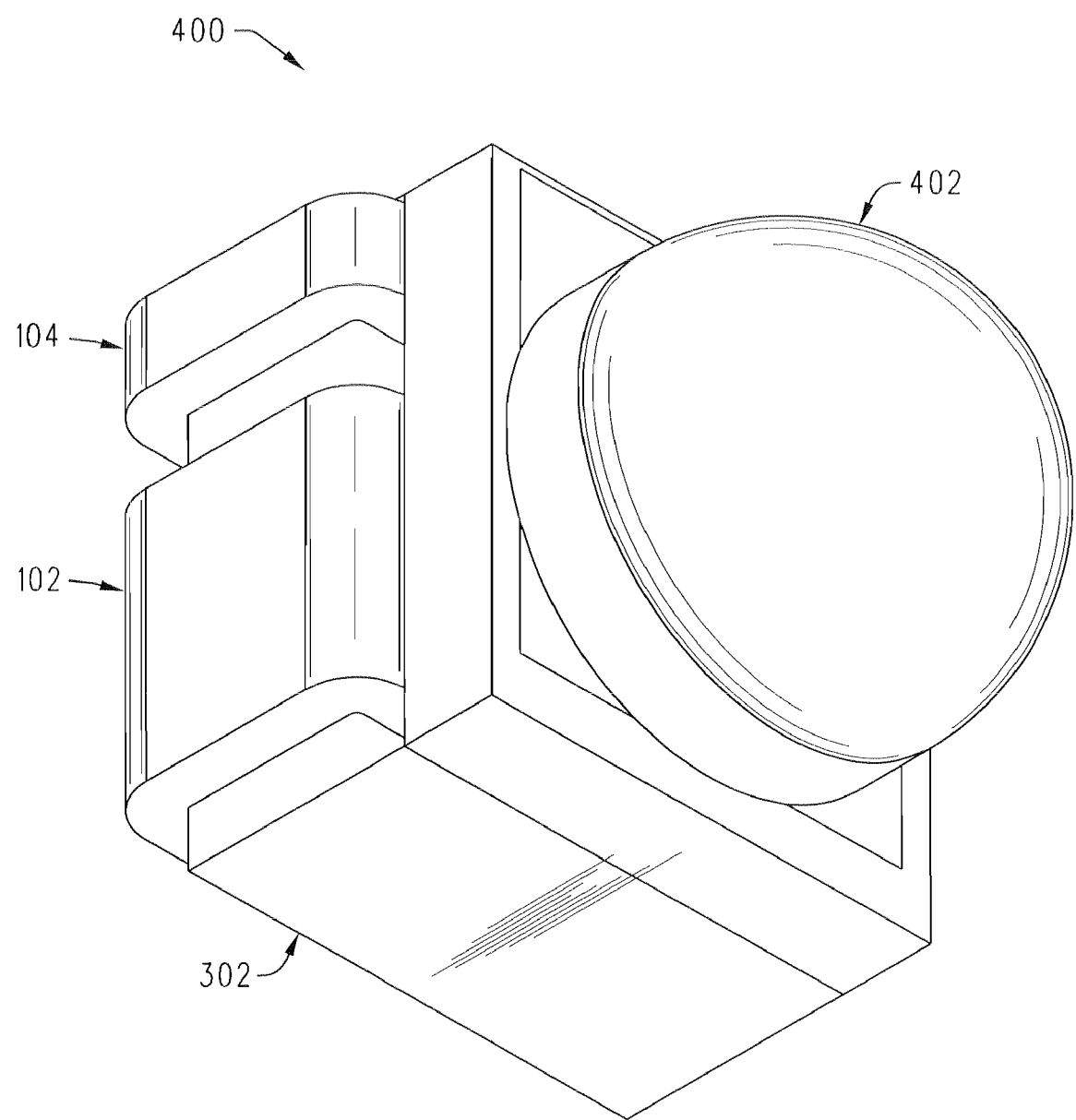
FIG. 4 is an isometric drawing of a PLCC package in accordance with an exemplary embodiment of the invention.

FIG. 4 is an isometric drawing of a PLCC package 400 in accordance with an exemplary embodiment of the invention. The first 102 and second 104 lead frames in this drawing are shown as part of the PLCC package 400. An optical lens 402 is also shown as part of the PLCC package 400. The dome-shaped optical lens is composed of encapsulant 606. The material used as an encapsulant 606 includes but is not limited to epoxy, silicone, a hybrid of silicone and epoxy, amorphous polyamide resin or fluorocarbon, glass and plastic. Also shown is the plastic structure body 302.

Figure 5:
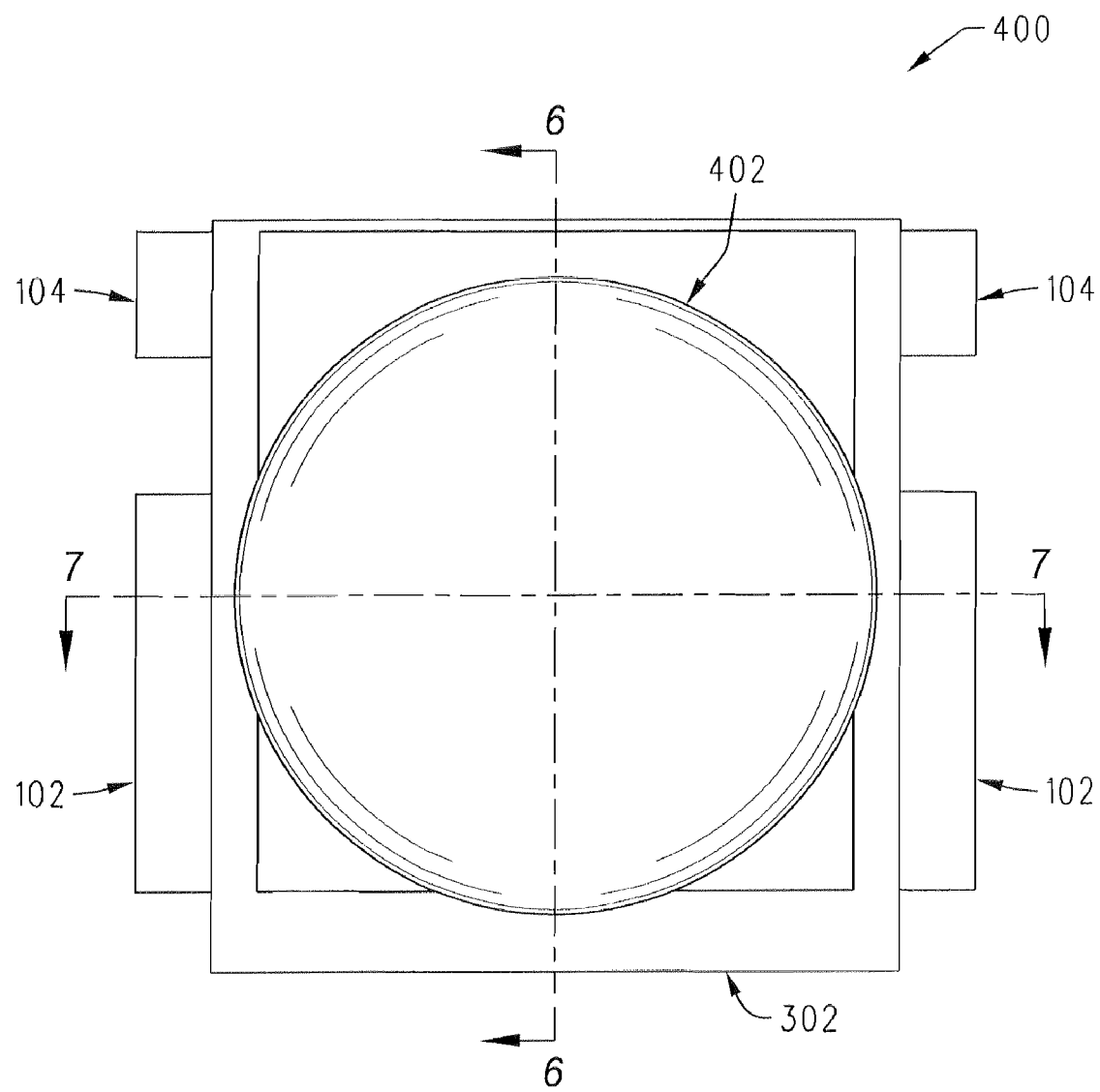
FIG. 5 is a top plan view of the PLCC package in accordance with an exemplary embodiment of the invention.

FIG. 5 is a top plan view of the PLCC package 400 in accordance with an exemplary embodiment of the invention. The first 102 and second 104 lead frames in this drawing are shown as part of the PLCC package 400. An optical lens 402 is also shown as part of the PLCC package 400. The dome-shaped optical lens is composed of encapsulant 606. Standard processes may be used to form the encapsulant 606. For example, an injection molding process, a transfer molding process or a compression molding process may be used. Also shown is the plastic structure body 302. Lines 6 and 7 in FIG. 5 indicate where sectional views of the PLCC package 400 are made. These sectional views are discussed below.

Figure 6:
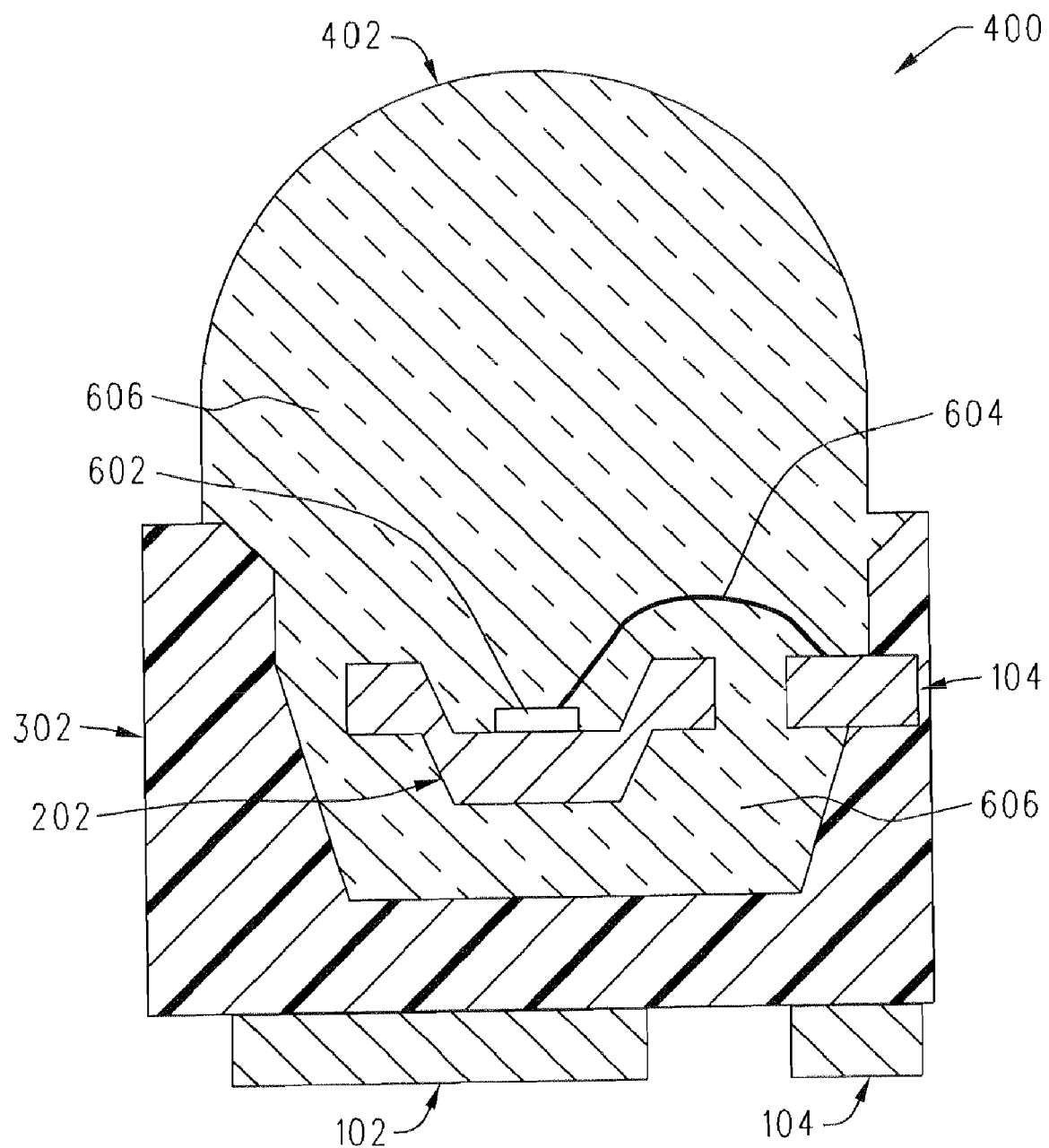
FIG. 6 is a sectional view of the PLCC package shown in FIG. 5 in accordance with an exemplary embodiment of the invention.

FIG. 6 is a sectional view of the PLCC package 400 shown in FIG. 5 in accordance with an exemplary embodiment of the invention. In this sectional view, the plastic structural body 302 is shown to have a cavity 304 which contains a portion of the encapsulant 606. This sectional view also shows that the reflector cup 202 is surrounded on four sides by the encapsulant 606. During the step of filling the cavity 304 of the plastic structural body 302 with encapsulant 606, a domed portion that functions as an optical lens 402 is formed on the PLCC package 400.

Because the reflector cup 202 is surrounded on four sides by the encapsulant 606, a CTE mismatch between the encapsulant 606 and the plastic structural body 302 will be less likely to cause problems related to thermal stress. For example, the occurrence of de-lamination between the light source 602 and the first lead frame 102 due to a CTE mismatch between the encapsulant 606 and the plastic structural body 302, will be less likely. Also, the occurrence of de-lamination between the light source 602 and the first lead frame 102 due to a CTE mismatch between the encapsulant 606 and the first 102 and/or the second 104 lead frames, will be less likely. In addition, since the encapsulant 606 and the optical lens 402 are made of the same material, CTE mismatch problems between them are also less likely to cause problems related to thermal stress.

FIG. 6 shows a wire bond 604 connected to the light source 602 and the second lead frame 104. The first 102 and second 104 lead frames provide electrical connections for the light source as well as leads for mounting. In this exemplary embodiment, the first 102 and second 104 lead frames also function as heat sinks to dissipate heat created by the light source 602.

Figure 7:
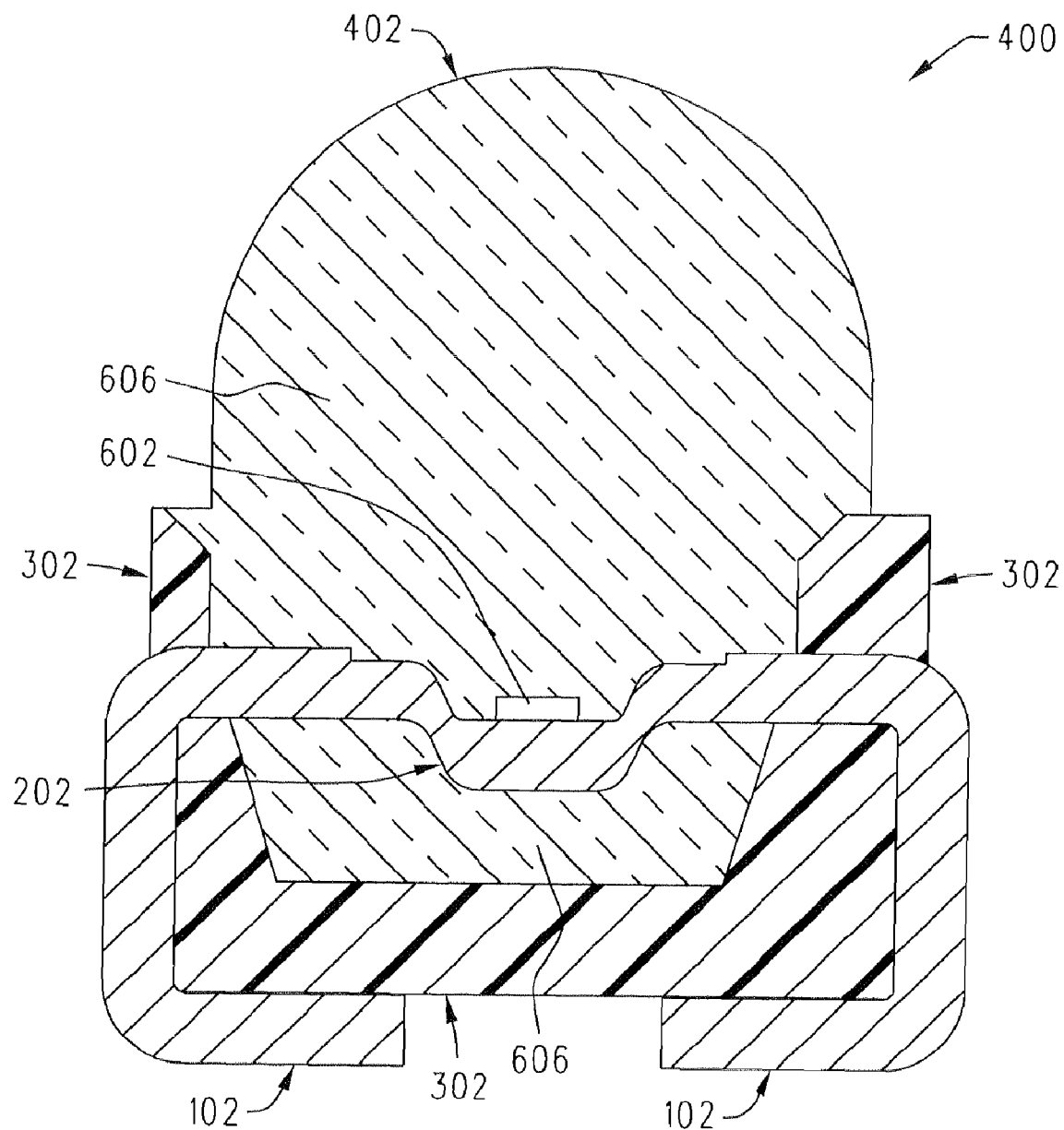
FIG. 7 is a sectional view of the PLCC package shown in FIG. 5 in accordance with an exemplary embodiment of the invention.

FIG. 7 is a sectional view of the PLCC package 400 shown in FIG. 5 in accordance with an exemplary embodiment of the invention. In this sectional view, the plastic structural body 302 is shown to have a cavity 304 which contains a portion of the encapsulant 606. This sectional view also shows that the reflector cup 202 is surrounded on two sides by the encapsulant 606. During the step of filling the cavity 304 of the plastic structural body 302 with encapsulant 606, a domed portion that functions as an optical lens 402 is formed on the PLCC package 400.

This sectional view also shows a light source 602 physically and electrically connected at the bottom of the reflector cup 202. The first lead frame 102 provides an electrical connection for the light source 602 as well as leads for mounting. In this exemplary embodiment, the leads shown are J-leads; other leads such as SOJ leads, gull wing leads, reverse gull wing leads and straight cut leads may be used in other embodiments of this invention.

Figure 8:
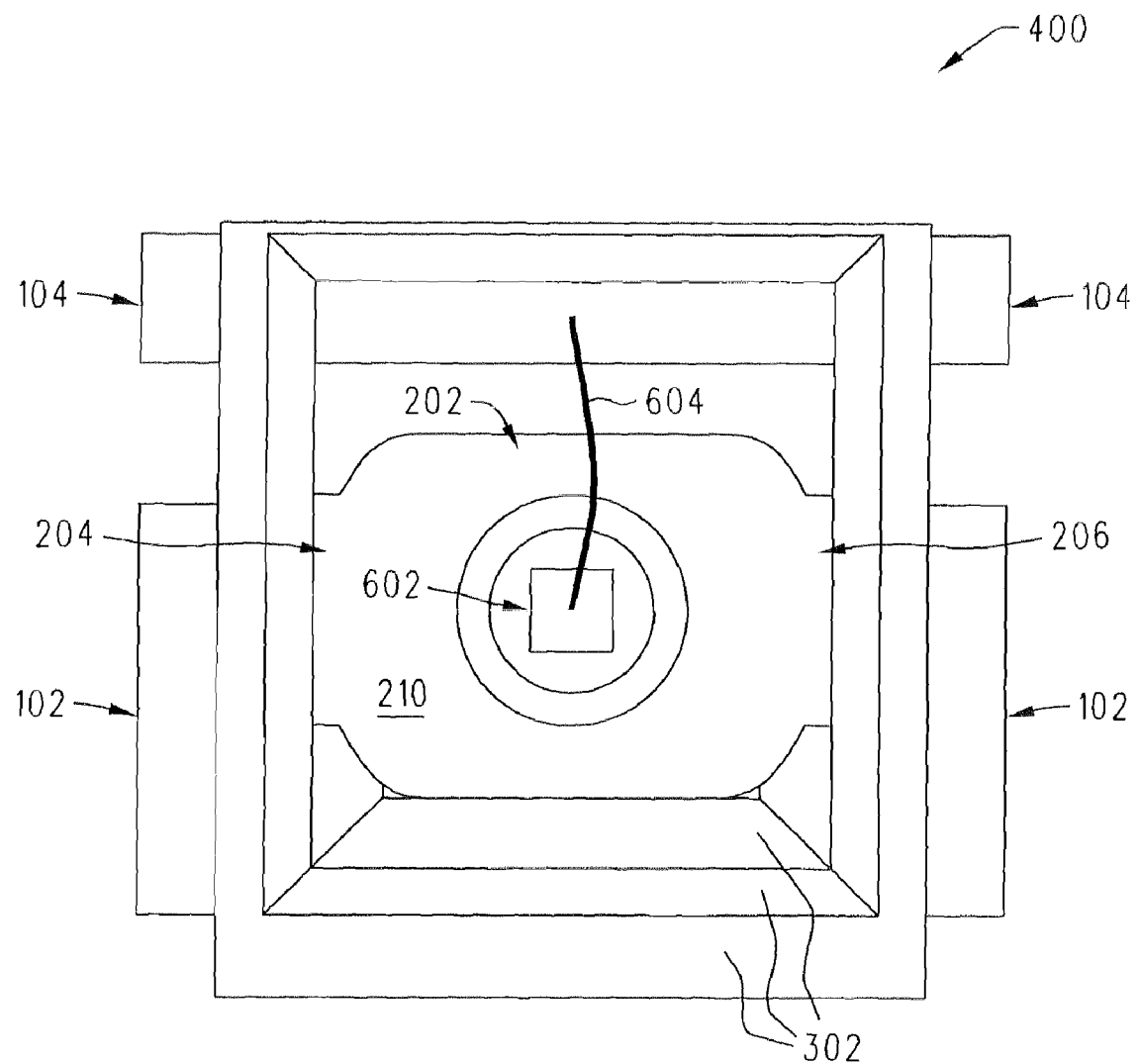
FIG. 8 is a top plan view of the PLCC package with the optical lens removed for clarity in accordance with an exemplary embodiment of the invention.

FIG. 8 is a top plan view of the PLCC package 400 with the optical lens removed for clarity in accordance with an exemplary embodiment of the invention. In this embodiment tongues 204 and 206 are supported by the plastic structural body 302. The first 204 and second 206 tongues are an integral part of the first lead frame 102. The first 204 and the second 206 tongues are substantially rigid to reduce movement of the reflector cup 202.

Reducing the movement of the reflector cup 202 lowers the probability of the wire bond separating from either the light source 602 or the second lead frame 104. When the wire bond 604 separates from either the light source 602 or the second lead frame 104, the electrical connection is opened and the light source 602 will not function. Reducing the movement of the reflector cup 202 also lowers the probability of the light source 602 separating from the reflector cup 202.

Figure 9:
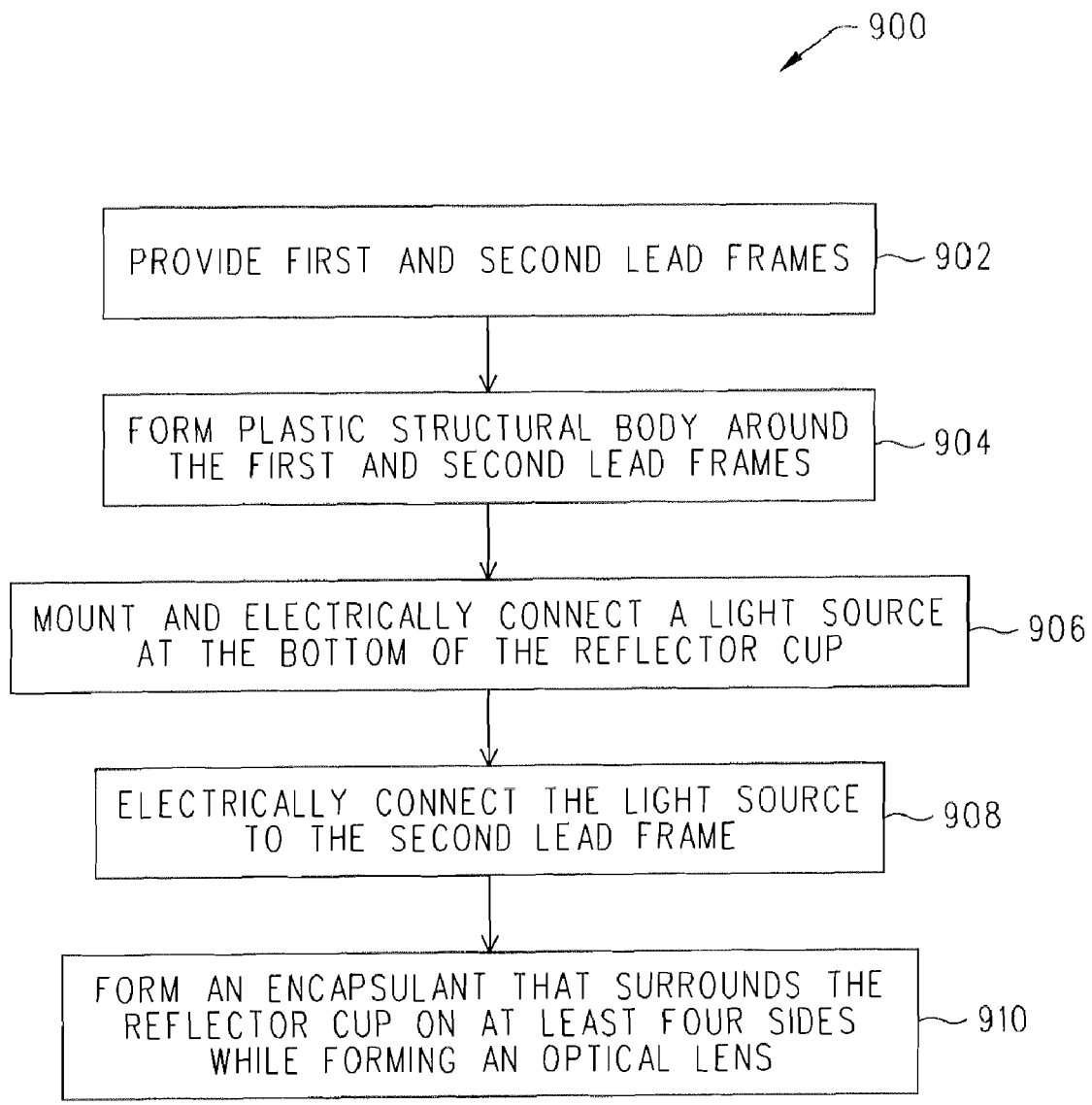
FIG. 9 is a process flow diagram of a method for making a PLCC package with a dome shaped optical lens in accordance with an embodiment of the invention.

FIG. 9 is a process flow diagram 900 of a method for making a PLCC package 400 with a dome shaped optical lens 402 in accordance with an embodiment of the invention. In this exemplary embodiment, a first 102 and a second 104 lead frame are provided as shown in box 902. Next as shown in box 904 a plastic structural body 302 is formed around the first 102 and second 104 lead frames. In this exemplary embodiment, the plastic structural body 302 is an integral single piece structure having a cavity 304 that serves as a container for containing a portion of an encapsulant 606.

Next as shown in box 906 a light source 602 is mounted and electrically connected at the bottom of the reflector cup 202. Next as shown in box 908 an electrical connection is made from the light source 602 to the second lead frame 104. In this exemplary embodiment, a wire bond 604 is used to make the electrical connection from the light source 602 to the second lead frame 104.

Next as shown in box 910 an encapsulant 606 is formed that surrounds the reflector cup 202 on four sides (106, 208, 210 and 212) while forming an optical lens 402. The encapsulant 606 also hermetically seals the light source 602. In this exemplary embodiment, the encapsulant 606 is an integral single piece structure.

Often reflective walls of a plastic structural body 302 are used to achieve a certain brightness needed for a specific application. In one exemplary embodiment, a white plastic material is used when forming a plastic structural body 302 in order to improve the brightness of the PLCC package 400.

In another exemplary embodiment, a black plastic material is used when forming a plastic structural body 302 in order to improve the contrast of the PLCC package 400.

The foregoing description has been presented for purposes of illustration and description. It is not intended to be exhaustive or to limit the invention to the precise form disclosed, and other modifications and variations may be possible in light of the above teachings. The exemplary embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A PLCC package comprising:
   a first lead frame comprising:
      a reflector cup formed in the first lead frame;
      a first tongue;
      a second tongue; and
      at least two leads;
   a second lead frame comprising:
      at least two leads;
   a plastic structural body;
   a light source;
   an encapsulant;
   an optical lens;
   wherein the first and the second lead frames are attached to the plastic structural body;
   wherein the light source is physically attached at the bottom of the inside of the reflector cup;
   wherein the light source is electrically connected to the reflector cup;
   wherein the light source is electrically connected to the second lead frame by a wire bond;
   wherein at least four sides of the reflector cup are surrounded by the encapsulant, the encapsulant having a domed portion that functions as the optical lens, the encapsulant being an integral single piece structure that comprises at least one material that is not included in the plastic structural body.

2. The PLCC package of claim 1 wherein the light source is an LED.

3. The PLCC package of claim 1 wherein the light source is a semiconductor laser.

4. The PLCC package of claim 1 wherein the encapsulant includes a material selected from a group consisting of epoxy, silicone, a hybrid of silicone and epoxy, amorphous polyamide resin or fluorocarbon, and glass and wherein the plastic structural body includes plastic.

5. The PLCC package of claim 1 wherein the encapsulant hermetically seals the light source and wherein the plastic structural body comprises a different coefficient of thermal expansion than the encapsulant.

6. The PLCC package of claim 1 wherein the first and second tongues are substantially rigid so as to reduce movement of the reflector cup.

7. The PLCC package of claim 1 wherein the at least two leads of the first and second lead frames includes leads selected from a group consisting of J leads, SOJ leads, gull wing leads, reverse gull wing leads and straight cut leads.

8. A PLCC package comprising:
   a first lead frame comprising:
      a reflector cup formed in the first lead frame;
      a first tongue;
      a second tongue; and
      at least two leads;
   a second lead frame comprising:
      at least two leads;
   a plastic structural body;
   a light source;
   an encapsulant;
   an optical lens;
   wherein the first and the second lead frames are attached to the plastic structural body;
   wherein the light source is physically attached at the bottom of the inside of the reflector cup;
   wherein the light source is electrically connected to the reflector cup;
   wherein the light source is electrically connected to the second lead frame by a wire bond;
   wherein at least four sides of the reflector cup are surrounded by the encapsulant, the encapsulant having a domed portion that functions as the optical lens, the encapsulant being an integral single piece structure; and
   wherein the plastic structural body is an integral single piece structure having a cavity that serves as a container for containing a portion of the encapsulant.

9. The PLCC package of claim 1 wherein the plastic structural body has dimensions that conforms to the PLCC-4 standard.

10. The PLCC package of claim 1 wherein the plastic structural body comprises a white plastic material.

11. The PLCC package of claim 1 wherein the plastic structural body comprises a black plastic material.

12. A method of manufacturing a PLCC package, the method comprising:
   providing a first lead frame, the first lead frame comprising:
      a reflector cup integral to the first lead frame;
      a first tongue;
      a second tongue; and
      at least two leads;

providing a second lead frame, the second lead frame comprising:
  at least two leads;
forming a plastic structural body around the first and second lead frames, the plastic structural body containing a cavity and comprising a first material having a first coefficient of thermal expansion;
mounting and electrically connecting a light source at a bottom of the reflector cup;
electrically connecting the light source to the second lead frame;
forming an encapsulant that surrounds at least four sides of the reflector cup while forming an optical lens on the PLCC package, the encapsulant comprising a second material having a second coefficient of thermal expansion different from the first coefficient of thermal expansion.

13. The method of claim 12 wherein the electrical connection between the light source and the second lead frame is a wire bond.

14. The method of claim 12 wherein forming the plastic structural body includes an injection molding process.

15. The method of claim 12 wherein forming the encapsulant is selected from a group consisting of transfer molding, compression molding and injection molding.

16. The method of claim 12 wherein the reflector cup is formed by stamping the first lead frame.

17. A method of manufacturing a PLCC package, the method comprising:
providing a first lead frame, the first lead frame comprising:
  a reflector cup integral to the first lead frame;
  a first tongue;
  a second tongue; and
  at least two leads;
providing a second lead frame, the second lead frame comprising:
  at least two leads;
forming a plastic structural body around the first and second lead frames, the plastic structural body containing a cavity;
mounting and electrically connecting a light source at a bottom of the reflector cup,
electrically connecting the light source to the second lead frame;
forming an encapsulant that surrounds at least four sides of the reflector cup while forming an optical lens on the PLCC package; and
wherein the plastic structural body is an integral single piece structure having a cavity that serves as a container for containing a portion of the encapsulant.

18. A device comprising:
at least one PLCC package; the at least one PLCC package comprising:
  a first lead frame comprising:
    a reflector cup established in the first lead frame;
    a first tongue;
    a second tongue; and
    at least two leads;
  a second lead frame comprising:
    at least two leads;
  a plastic structural body;
  a light source;
  an encapsulant;
  an optical lens;
  wherein the first and the second lead frames are attached to the plastic structural body;
  wherein the light source is physically attached at the bottom of the inside of the reflector cup;
  wherein the light source is electrically connected to the reflector cup;
  wherein the light source is electrically connected to the second lead frame by a wire bond;
  wherein at least four sides of the reflector cup are surrounded by the encapsulant, the encapsulant having a domed portion that functions as the optical lens, the encapsulant being an integral single piece structure that comprises a different coefficient of thermal expansion as compared to the plastic structural body.

19. The device of claim 18 wherein the at least two leads of the first and second lead frames includes leads selected from a group consisting of J leads, SOJ leads, gull wing leads, reverse gull wing leads and straight cut leads.

20. The device of claim 18 wherein the encapsulant includes a material selected from a group consisting of epoxy, silicone, a hybrid of silicone and epoxy, amorphous polyamide resin or fluorocarbon, glass and plastic.

* * * * *